(12) United States Patent
Liang et al.

(10) Patent No.: US 11,442,235 B1
(45) Date of Patent: Sep. 13, 2022

(54) OPTICAL SYSTEM INCLUDING OPTICAL DEVICES HAVING IN-SITU CAPACITIVE STRUCTURES

(71) Applicant: Hewlett Packard Enterprise Development LP, Houston, TX (US)

(72) Inventors: Di Liang, Santa Barbara, CA (US); Sudharsanan Srinivasan, Santa Barbara, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 17/444,000

(22) Filed: Jul. 29, 2021

(51) Int. Cl.
| | | |
|---|---|---|
| G02B 6/42 | (2006.01) | |
| H04B 10/079 | (2013.01) | |
| G01J 1/46 | (2006.01) | |
| H04B 10/69 | (2013.01) | |
| H04B 10/50 | (2013.01) | |

(52) U.S. Cl.
CPC .............. *G02B 6/4286* (2013.01); *G01J 1/46* (2013.01); *H04B 10/0799* (2013.01); *H04B 10/50* (2013.01); *H04B 10/69* (2013.01)

(58) Field of Classification Search
None
See application file for complete search history.

(56) References Cited

U.S. PATENT DOCUMENTS

| | | | |
|---|---|---|---|
| 6,175,672 B1 * | 1/2001 | Newberg | ........... H04B 10/2575 385/1 |
| 6,985,648 B2 | 1/2006 | Kish et al. | |
| 7,043,097 B2 | 5/2006 | Coldren et al. | |
| 7,164,699 B1 | 1/2007 | Braun et al. | |
| 7,289,197 B2 | 10/2007 | Kewitsch | |
| 7,495,203 B2 | 2/2009 | Kaku et al. | |
| 7,519,246 B2 | 4/2009 | Welch et al. | |
| 7,751,658 B2 | 7/2010 | Welch et al. | |
| 9,612,503 B2 | 4/2017 | Liang | |

(Continued)

FOREIGN PATENT DOCUMENTS

WO 2004/034530 A1 4/2004

OTHER PUBLICATIONS

Stabile, R. et al.; "Optical power meter co-integrated with a fast optical switch for on-chip OSNR monitoring"; Sep. 22-25, 2015; 3 pages.

(Continued)

*Primary Examiner* — David W Lambert
(74) *Attorney, Agent, or Firm* — Sheppard Mullin Richter & Hampton LLP

(57) ABSTRACT

Examples described herein relate to an optical system. In some examples, the optical system may include a light-conducting medium and a first optical device to transmit an optical signal over the light-conducting medium. Further, the optical system may include a second optical device coupled to the light-conducting medium to receive an optical signal transmitted by the first optical device. In some examples, at least one of the first optical device, the light-conducting medium, and the second optical device may include an in-situ capacitive structure to detect light intensity. Moreover, the optical system may include a monitoring circuit electrically coupled to the in-situ capacitive structure to generate an electrical signal indicative of the light intensity detected by the in-situ capacitive structure.

17 Claims, 4 Drawing Sheets

(56) References Cited

U.S. PATENT DOCUMENTS

| | | | |
|---|---|---|---|
| 9,791,347 B2 | 10/2017 | Guimond | |
| 2006/0268395 A1 | 11/2006 | Steckl et al. | |
| 2008/0044128 A1 | 2/2008 | Kish et al. | |
| 2012/0087659 A1* | 4/2012 | Gill | H04B 10/506 398/49 |
| 2016/0164601 A1* | 6/2016 | Perron | G01M 11/33 398/38 |
| 2016/0315451 A1 | 10/2016 | De et al. | |
| 2016/0359074 A1* | 12/2016 | Melloni | G02B 6/12 |
| 2020/0003978 A1 | 1/2020 | Kewitsch | |
| 2021/0006044 A1 | 1/2021 | Hong et al. | |
| 2021/0173238 A1* | 6/2021 | Hosseinzadeh | G02F 1/2257 |

OTHER PUBLICATIONS

Zhu, H. et al.; "On-Chip Optical Power Monitor Using Periodically Interleaved P—N Junctions Integrated on a Silicon Waveguide"; Jan. 22, 2014; 8 pages.

\* cited by examiner

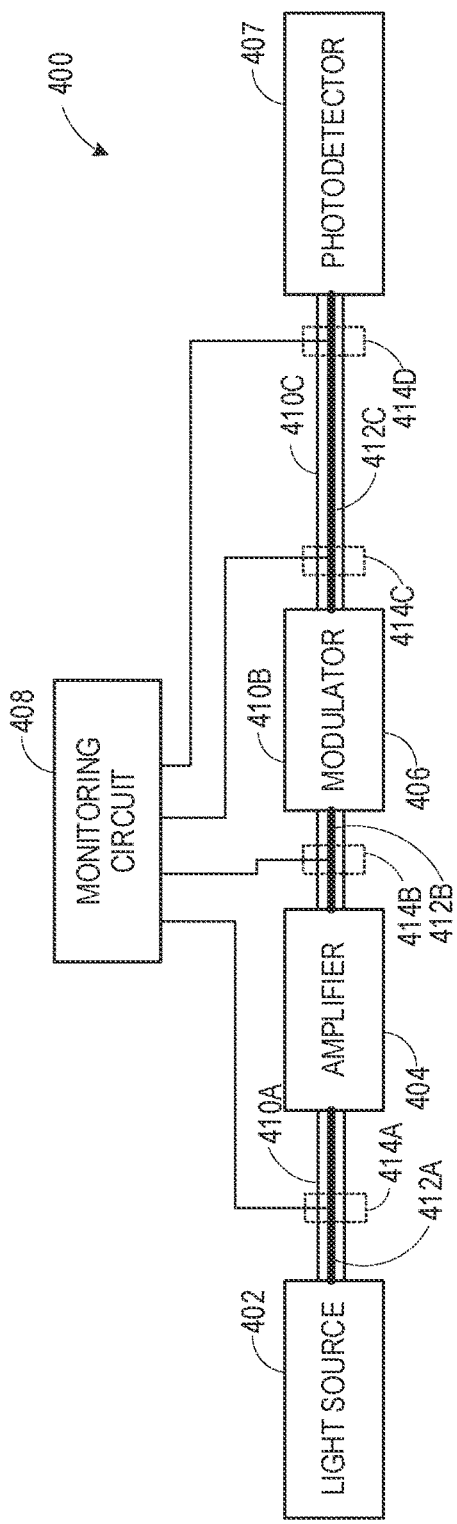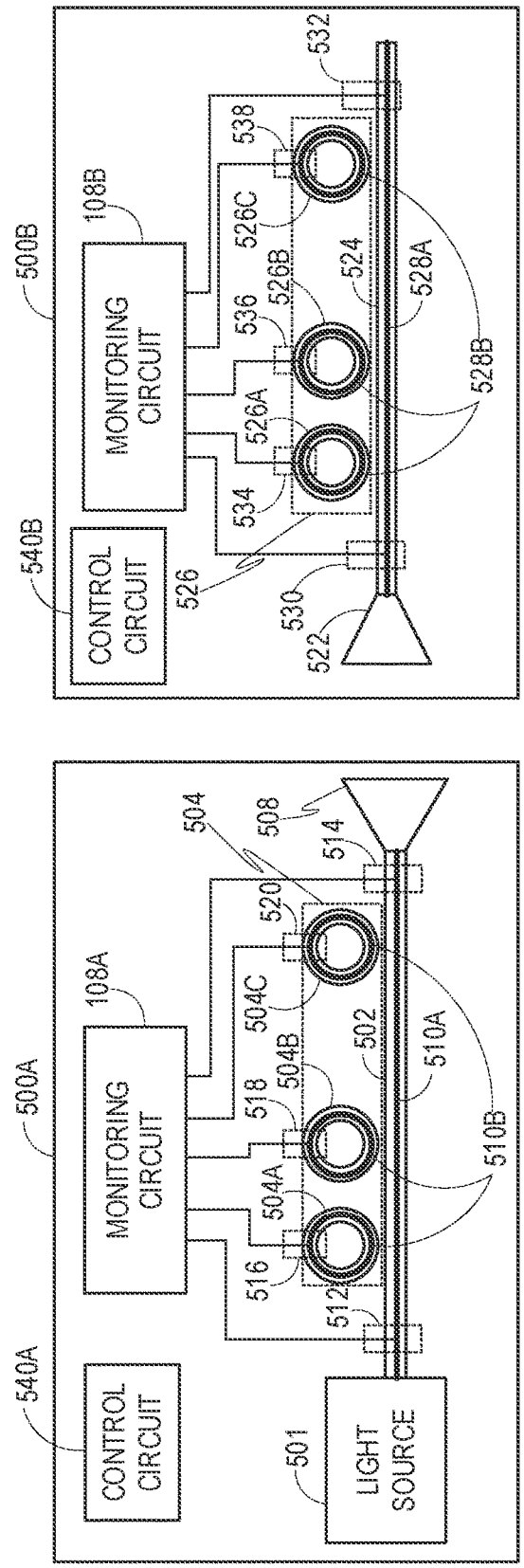

OPTICAL SYSTEM INCLUDING OPTICAL DEVICES HAVING IN-SITU CAPACITIVE STRUCTURES

BACKGROUND

Optical systems include optical devices that can generate, process, and/or carry optical signals from one point to another point. In certain implementations, optical systems such as optical communication systems may facilitate data communication over longer distances with higher bandwidth using smaller cable width (or diameter) in comparison to communication systems using electrical wires. In an optical communication system, a light may be modulated by an optical transmitter and demodulated by an optical receiver that includes photosensitive devices, for example.

BRIEF DESCRIPTION OF THE DRAWINGS

Various examples will be described below with references to the following figures.

FIG. 4 depicts a single-channel optical communication system, in accordance with an example.

FIG. 5A depicts a dense wavelength division multiplexing (DWDM) transmitter, in accordance with an example.

FIG. 5B depicts a DWDM receiver, in accordance with an example.

Figure 1:
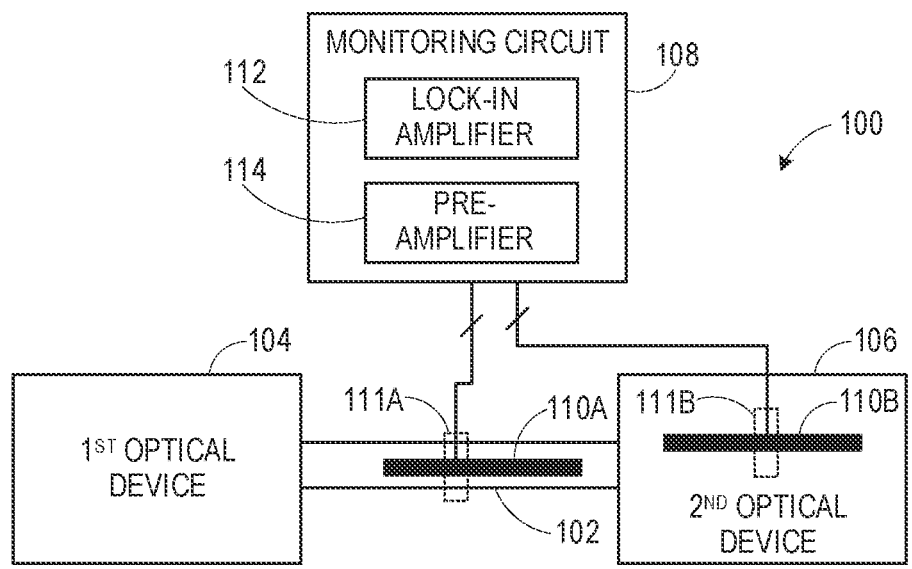
FIG. 1 depicts an optical system, in accordance with an example.

It is emphasized that, in the drawings, various features are not drawn to scale. In fact, in the drawings, the dimensions of the various features have been arbitrarily increased or reduced for clarity of discussion.

DETAILED DESCRIPTION

The following detailed description refers to the accompanying drawings. Wherever possible, the same reference numbers are used in the drawings and the following description to refer to the same or similar parts. It is to be expressly understood that the drawings are for the purpose of illustration and description only. While several examples are described in this document, modifications, adaptations, and other implementations are possible. Accordingly, the following detailed description does not limit disclosed examples. Instead, the proper scope of the disclosed examples may be defined by the appended claims.

Optical systems may include various optical devices such as, but not limited to, light sources (e.g., lasers), optical modulators, optical filters, optical amplifiers, optical couplers, waveguides, optical combiners, optical multiplexers, optical demultiplexers, optical resonators, or photodetectors (e.g., photodiodes). Some optical systems may include light monitoring systems that monitor optical signals contained within one or more such optical components. Such monitoring of the light may be useful in correcting certain operational parameters, for example, biasing conditions in the presence of changing environmental conditions or aging.

A common technique used in some light monitoring systems entails extracting a small portion of the light from an optical component using one or more optical splitters. The extracted light may be routed to one or more separate photodetectors that convert the light into an electrical signal (e.g., electrical current). Such extraction of the light and routing of the extracted light to the separate photodetectors may result in wastage of useful optical power. Further, the photodetectors used to convert the light into electrical signals might not have been properly calibrated, resulting in the inaccurate generation of the electrical signals. Moreover, when the optical system includes several optical components cascaded in a long chain, the use of the abovementioned light monitoring technique may result in increased optical losses. Additionally, the above-described light monitoring technique may suffer from the uncertainty in the splitting ratio among the various splitters used, even if the design of the splitters is similar. Furthermore, the light from the splitter may be routed across a chip to the photodetector which may lead to further uncertainties in the power level or unavoidable waveguide crossings. In some implementations, the use of additional structural elements such as separate photodiodes may require additional space leading to an increase in the overall footprint of the optical system and/or the ring resonator or require compromise on internal structure and/or efficiency of the ring resonator.

In accordance with one or more examples presented herein, an optical system is provided. An example optical system may include optical devices made of semiconductor materials and a monitoring circuit. Some of the optical devices used in the example optical system may include an in-situ capacitive structure that is integral with the structures of the optical devices. The in-situ capacitive structure may be a metal-oxide-semiconductor (MOS) capacitor formed within the structures of the optical devices. The in-situ capacitive structure may aid in the detection of light without extracting light out of the optical devices. Further, the monitoring circuit may be electrically coupled to in-situ capacitive structure(s) at one or more monitoring sites within the optical system to cause the generation of electrical signals. The electrical signals may be representative of intensities of light in the optical devices at the respective monitoring sites. Using the electrical signals generated via the in-situ capacitive structure(s), the monitoring circuit may determine various optical parameters, such as but not limited to, an output optical power of a light source, an optical power inside the optical devices, an optical gain, an insertion loss, a link budget, etc. The use of the in-situ capacitive structure may obviate the need for separate photodiodes to monitor the light, resulting in a compact footprint and reduced complexity of the proposed optical system.

FIG. 1 presents an example optical system 100. The optical system 100 may include a plurality of optical devices capable of generating, processing, and/or allowing passage of an optical signal (i.e., light). In the example of FIG. 1, the optical system 100 includes a light-conducting medium 102, a first optical device 104, a second optical device 106, and a monitoring circuit 108.

The light-conducting medium 102 comprises an optical waveguide such as a semiconductor waveguide. The first optical device 104 comprises an optical device capable of generating and/or processing optical signals. Examples of the first optical device 104 may include, but are not limited to, a light source, an optical amplifier, an optical modulator, an optical splitter, an optical combiner, an optical coupler, an optical filter, an optical resonator, or a photodetector. Furthermore, the second optical device 106 may comprise an optical device capable of generating and/or processing the optical signals. Examples of the second optical device 106 may include, but are not limited to, an optical amplifier, an optical modulator, an optical splitter, an optical combiner, an optical coupler, an optical filter, an optical resonator, or a photodetector.

The first optical device 104 and the second optical device 106 are coupled to the light-conducting medium 102. The first optical device 104 may transmit an optical signal over the light-conducting medium 102. The second optical device 106 coupled to the light-conducting medium 102 may receive the optical signal transmitted by the first optical device 104. At least one of the first optical device 104, the light-conducting medium 102 and the second optical device 106 may include an in-situ capacitive structure to detect light intensity. In the example implementation of FIG. 1, the light-conducting medium 102 and the second optical device 106 are respectively shown to include the in-situ capacitive structures 110A and 110B (also, collectively referred to as the in-situ capacitive structures 110A-110B).

In some examples, the in-situ capacitive structures 110A-110B may be a metal-oxide-semiconductor (MOS) capacitor formed within the device structures of the light-conducting medium 102 and the second optical device 106, respectively. The in-situ capacitive structures 110A-110B may aid in the detection of light within the light-conducting medium 102 and the second optical device 106, respectively, without extracting the light. In one example, the in-situ capacitive structures 110A-110B may include defect sites (see FIG. 2) that, upon application of voltage across the in-situ capacitive structures 110A-110B, may cause the generation of free charge carriers relative to the intensity of the optical signal inside the respective optical components. As will be understood, the generation of free charge carriers may result in a change (e.g., increase) in the conductance of a given region (e.g., a waveguide region) within the respective optical components. The changes in the conductance of the given region may cause variations in the current passing through the given region which may be monitored by the monitoring circuit 108. Additional details regarding an example in-situ capacitive structures, such as the in-situ capacitive structures 110A-110B, are described in FIG. 2.

The monitoring circuit 108 may be electrically coupled to the in-situ capacitive structures 110A, 110B at monitoring sites 111A and 111B. In some examples, the monitoring circuit 108 may cause the in-situ capacitive structures 110A, 110B to generate electrical signals indicative of the light intensities at the monitoring sites 111A and 111B, respectively. To effect the generation of the electrical signals, in some examples, the monitoring circuit may include a lock-in amplifier 112 and a preamplifier 114. In some examples, the lock-in amplifier 112 may generate a reference variable voltage signal, for example, a sinusoidal signal. For a given in-situ capacitive structure, the lock-in amplifier 112 may determine a frequency of the reference variable voltage signal based on a conductance of a waveguide region in the given in-situ capacitive structure and a capacitance of the given in-situ capacitive structure. In one example, the lock-in amplifier 112 may determine the frequency ($F_0$) of the reference variable voltage signal based on an example relationship of equation (1).

$$F_0 = \frac{G_{WG}}{2\pi * C} \quad \text{Equation (1)}$$

where, $G_{WG}$ represents the conductance of the waveguide region in the given in-situ capacitive structure and C represents the capacitance of the given in-situ capacitive structure. In certain other examples, the frequency ($F_0$) of the reference variable voltage signal may be set to any value greater than $$\frac{G_{WG}}{2\pi * C}.$$

The monitoring circuit 108 may apply a reference variable voltage signal to the in-situ capacitive structures 110A-110B. As previously noted, the conductance of the given regions (e.g., waveguide) within the light-conducting medium 102 and the second optical device 106 may change depending on the intensities of the optical signal therein. Consequently, the current flowing through the given regions (e.g., waveguide) within the light-conducting medium 102 and the second optical device 106 may also vary. In particular, the magnitude of electrical current generated by the in-situ capacitive structures 110A, 110B may be influenced by the light intensities inside the light-conducting medium 102 and the second optical device 106, respectively, because the waveguide conductance of a waveguide region at the monitoring sites 111A, 111B changes due to the presence of free carriers created by the absorption of photons at the defect sites.

The monitoring circuit 108 may measure the electrical signals (e.g., electrical currents) passing generated by the in-situ capacitive structures 110A-110B at the monitoring sites 111A, 111B, that are in turn representative of intensities of the optical signals inside the light-conducting medium 102 and the second optical device 106. In some examples, the electrical currents received by the monitoring circuit 108 from the in-situ capacitive structures 110A-110B may be weak in strength. The preamplifier 114 may amplify the electrical currents for further processing by the lock-in amplifier 112.

Figure 2:
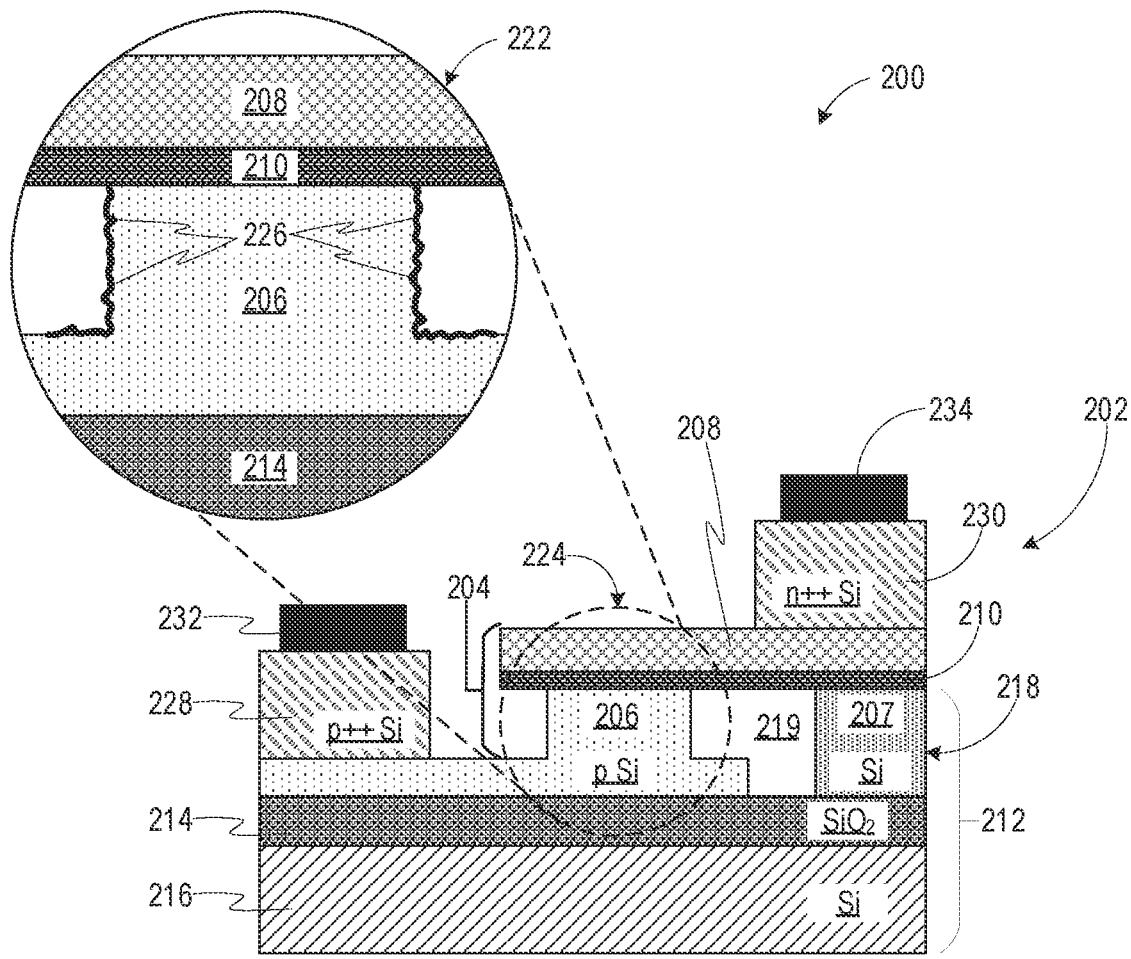
FIG. 2 depicts a cross-sectional view of an optical device having an in-situ capacitive structure, in accordance with an example.

In FIG. 2, a cross-sectional view 200 of an example optical device 202 having an in-situ capacitive structure 204 is presented. The optical device 202 may be an example representative of any of the light-conducting medium 102, the first optical device 104, the second optical device 106 depicted in FIG. 1. The optical device 202 may include a waveguide region 206, a buffer semiconductor region 208, and an insulating layer 210 that may together define a metal-oxide-semiconductor (MOS) capacitor, also referred herein as, the in-situ capacitive structure 204. In particular, the insulating layer 210 may be formed between the waveguide region 206 and the buffer semiconductor region 208 such that the insulating layer 210 may act as an electric insulator between two electrically conductive regions, namely, the waveguide region 206 and the buffer semiconductor region 208.

The optical device 202 may be formed using a substrate 212. In some examples, the substrate 212 may include a base substrate layer 216 made of semiconductor material, for example, silicon (Si). Other examples of materials that may be used to form the base substrate layer 216 may include III-V semiconductors, such as indium phosphide (InP), germanium (Ge), gallium arsenide (GaAs), aluminum gallium arsenide (AlGaAs), indium gallium arsenide (InGaAs), indium arsenide (InAs), or combinations thereof. Further, as depicted in FIG. 2, the substrate 212 may include a base oxide layer 214 disposed on an underlying base substrate layer 216. For example, the base oxide layer 214 may be formed by oxidizing the substrate 212. As another example, the base oxide layer 214 may be deposited on the substrate 212. In the implementation of FIG. 2, for the silicon base substrate layer 216, the base oxide layer 214 may comprise silicon dioxide ($SiO_2$), which may be formed in the presence of oxygen at a temperature in the range from 900° C. to 1380° C. In some examples, the base oxide layer 214 may be a buried oxide (BOX) layer (e.g., the $SiO_2$ may be buried in the base substrate layer 216). In some examples, a layer of the $SiO_2$ may be buried in the base substrate layer 216 at a depth ranging from less than 100 nm to several micrometers from the wafer surface depending on the application. Other examples of the base oxide layer 214 may include, but are not limited to, Silicon Nitride ($Si_3N_4$), Aluminum oxide ($Al_2O_3$), Hafnium Dioxide ($HfO_2$), diamond, silicon carbide (SiC), or combinations thereof.

Further, the substrate 212 may include a device layer 218 disposed on top of the base oxide layer 214. In the example implementation of FIG. 2, the device layer 218 is composed of silicon. The device layer 218 may be suitably shaped (e.g., via techniques such as photolithography and etching) to form one or more regions, such as, the waveguide region 206 and a non-waveguide region 207 separated via an air-trench 219. The waveguide region 206 carries an optical signal during the operation of the optical device 202. In some examples, the waveguide region 206 may include a first-type doping (e.g., p-type doping) or compensation doped to generate a net doping of the first-type. The waveguide region 206 may be lightly doped, resulting in improved sensitivity to a reference variable voltage applied by the monitoring circuit, for example, the monitoring circuit 108 depicted in FIG. 1.

The waveguide region 206 may have one or more defect sites 226 as depicted in an enlarged view 222 of a portion 224 of the waveguide region 206). The term "defect sites" as used herein may refer to imperfections in the bulk of the material of the waveguide region 206, surface imperfections at the boundaries of the waveguide region 206, or both. In some examples, the defect sites may be resulted from imperfections in the manufacturing process as well as intentionally created. The existence of the defect sites 226 may absorb photons and cause the generation of free charge carriers relative to the intensity of the optical signal impinging thereon inside the waveguide region 206. The conductance of the waveguide region 206 depends on the amount of the free charge carriers, such that an increase in the optical signal causes an increase in the conductance of the waveguide region 206.

The insulating layer 210 is disposed over the waveguide region 206 and/or the non-waveguide region 207. In particular, the insulating layer 210 is formed such that the insulating layer 210 is sandwiched between the waveguide region 206 and the buffer semiconductor region 208. The insulating layer 210 may be formed of one or more dielectric materials, including but not limited to, native oxides of the materials of the waveguide region 206 or the buffer semiconductor region 208, or both, or external dielectric materials such as high-k dielectrics or polymers which can be formed by deposition, oxidation, wafer bonding or other dielectric coating methods. Other non-limiting examples of the dielectric materials that can be used to form the insulating layer 210 may include, $SiO_2$, $Si_3N_4$, $Al_2O_3$, $HfO_2$, polyimide, benzocyclobutene (BCB), or combinations thereof.

Further, the buffer semiconductor region 208 may be made of semiconductor material, such as a III-V semiconductor. Examples of the III-V materials that may be used to form the buffer semiconductor region 208 may include, but are not limited to, GaAs, Gallium nitride (GaN), or Indium nitride (InN). The buffer semiconductor region 208 may be formed over the insulating layer 210 using techniques such as, but not limited to, deposition, wafer bonding, monolithic growth, or other fabrication techniques. In some examples, the buffer semiconductor region 208 may include a second-type doping (e.g., n-type doping) different from the first-type doping.

Furthermore, in some examples, the optical device 202 may include a first contact region 228 and a second contact region 230. For illustration purposes, in FIG. 2, the contact regions 228 and 230 are shown as made of silicon. In some other examples, the contact regions 228 and 230 may be made of other semiconductor materials including, but not limited to, InP, Ge, GaAs, AlGaAs, InGaAs, or combinations thereof. The first contact region 228 may include the first-type doping and is disposed in contact with the waveguide region 206. Further, the second contact region 230 may include the second-type doping and is disposed in contact with the buffer semiconductor region 208.

Moreover, in some examples, the optical device 202 may include metal contacts, such as, a first metal contact 232 and a second metal contact 234 (hereinafter collectively referred to as metal contacts 232 and 234). As depicted in FIG. 1B, the first metal contact 232 and the second metal contact 234 are respectively disposed in electrical contact (e.g., in direct physical contact or via any intermediate electrically conductive material) with the first contact region 228 and the second contact region 230, respectively. In some examples, the metal contacts 232 and 234 may be formed on top of (i.e., vertically over) the first contact region 228 and the second contact region 230, respectively. Examples of materials used to form the metal contacts 232 and 234 may include, but are not limited to, copper (Cu), gold (Au), Al, and/or platinum (Pt). In an example, optical system (e.g., the optical system 100), the monitoring circuit 108 may be electrically connected to the contact regions 228 and 230 via respective metal contacts 232 and 234.

During operation, an optical signal is received by the optical device 202 and passes through the waveguide region 206. To monitor the light intensity, the monitoring circuit may apply the reference variable voltage signal across the contact regions 228 and 230 and measure electrical current at the contact region 230. As previously noted, changes in the light intensities inside the waveguide region 206 may cause changes in the conductance of the waveguide regions 206. Consequently, the current flowing through the in-situ capacitive structure 204 may vary. Such current flowing through the in-situ capacitive structure 204 may be monitored by the monitoring circuit at the contact region 230.

Figure 3:
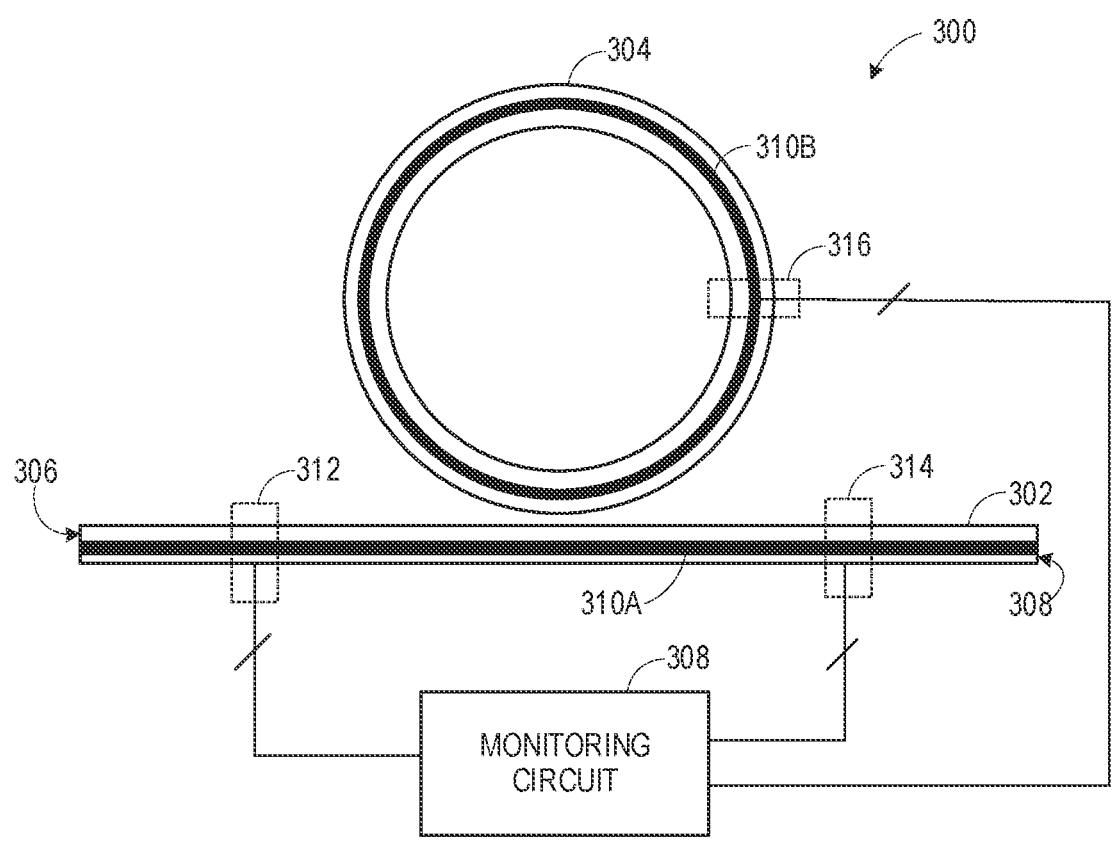
FIG. 3 depicts an optical system, in accordance with another example.

Referring now to FIG. 3, an example optical system 300 is presented. The optical system 300 of FIG. 3 may be representative of one example of the optical system 100 of FIG. 1. The optical system 300 may include a plurality of optical devices capable of generating, processing, and/or allowing passage of an optical signal. In the example implementation shown in FIG. 3, the optical system 300 is shown to include optical devices, such as, a coupling waveguide 302 and an optical modulator 304. Further, the optical system 300 may include a monitoring circuit 308. The monitoring circuit 308 may be as described with respect to monitoring circuit 108.

The optical modulator 304 may include a waveguide of any shape, for example, annular, straight, or having one or more curves. For illustration purposes, in FIG. 3, the optical modulator 304 is shown to have a ring shape. The optical modulator 304 may also be formed to have any other shapes, for example, a loop of any shape (e.g., circular loop, oval loop, rounded rectangle loop, rounded square loop, rounded triangle loop, etc.), within the purview of the present disclosure. By way of example, the optical modulator 304 formed of an annular waveguide having a loop shape that is elongated to have a straight section along one direction (e.g., racetrack-shaped) is also envisioned within the purview of the present disclosure. The optical modulator 304 may have a resonant wavelength which may be a function of its physical parameters, for example, dimensions and/or material properties. The resonant wavelength of the optical modulator 304 may be tuned electrically by suitably changing a biasing voltage applied to optical modulator 304 and/or by locally heating the optical modulator 304 via resistor heaters.

The coupling waveguide 302 may be disposed adjacent to and is evanescently coupled to the optical modulator 304. The coupling waveguide 302 may include an input port 306 and an output port 308. An optical signal may be supplied to coupling waveguide 302 via the input port 306. From the optical signal supplied at the input port 306, a light wave having a wavelength equal to the resonant wavelength of the optical modulator 304 may be coupled into (e.g., trapped inside) the optical modulator 304. In some examples, the coupling waveguide 302 may include a first in-situ capacitive structure 310A formed along at least a portion of the coupling waveguide 302 to detect light intensity inside the coupling waveguide 302. The first in-situ capacitive structure 310A may be similar, in one or more aspects, to the in-situ capacitive structure 204 depicted in FIG. 2 details of which are not repeated herein.

The monitoring circuit 308 may be electrically connected to the first in-situ capacitive structure 310A at one or more sites, for example, at a first monitoring site 312 and at a second monitoring site 314. In particular, the optical modulator 304 may be optically coupled to the coupling waveguide 302 between the first monitoring site 312 and the second monitoring site 314. During operation, the monitoring circuit 308 may cause the first in-situ capacitive structure 310A to generate a first electrical signal and a second electrical signal respectively at the first monitoring site 312 and the second monitoring site 314. The first electrical signal and the second electrical signal are indicative of the light intensities at the first monitoring site 312 and the second monitoring site 314, respectively. The monitoring circuit 308 may apply reference variable voltage signals to the first in-situ capacitive structure 310A at the first monitoring site 312 and the second monitoring site 314. Based on the reference variable voltage signals applied at the first monitoring site 312 and the second monitoring site 314, the first electrical signal and the second electrical signals are generated at the first monitoring site 312 and the second monitoring site 314, respectively, which may be received by the monitoring circuit 308. The monitoring circuit 308 may utilize the first electrical signal and the second electrical signal to determine an optical property, such as, an insertion loss of the optical modulator 304. For example, the monitoring circuit 308 may divide the first electrical signal by the second electrical signal. The resulting ratio between the first electrical signal and the second electrical signal may be indicative of an insertion loss caused by the optical modulator 304.

In some examples, the optical system 300 may include one or more additional optical modulators (not shown in FIG. 3, see FIG. 5A) optically coupled to the coupling waveguide between the first monitoring site 312 and at the second monitoring site 314 forming a bank of optical modulators including the optical modulator 304 and the one or more additional optical modulators. In such an implementation, the monitoring circuit 308 may determine an insertion loss of the bank of optical modulators based on the first electrical signal and the second electrical signal. For example, the monitoring circuit 308 may divide the first electrical signal by the second electrical signal, where the resulting ratio between the first electrical signal and the second electrical signal may be indicative of the insertion loss caused by the bank of optical modulators.

In certain examples, the optical modulator 304 may also include a second in-situ capacitive structure 310B to detect light intensity inside the optical modulator 304. The second in-situ capacitive structure 310B may be similar, in one or more aspects, to the in-situ capacitive structure 204 depicted in FIG. 2. Also, in some examples, the monitoring circuit 308 may be electrically connected to the second in-situ capacitive structure 310B at a third monitoring site 316. The monitoring circuit 308 may cause the second in-situ capacitive structure 310B to generate a third electrical signal indicative of the light intensity at the third monitoring site 116 by applying a reference variable voltage signal to the second in-situ capacitive structure 310B at the third monitoring site 116.

Turning now to FIG. 4, an example single-channel optical communication system 400 is presented. The single-channel optical communication system 400 may be representative of an example of the optical systems 100 and 300 described in FIGS. 1 and 3. In some examples, the single-channel optical communication system 400 may include a light source 402, an optical amplifier 404, an optical modulator 406, a photodetector 407 coupled in series via optical waveguides (e.g., fiber optic cables) 410A, 410B, and 410C. Although not depicted in FIG. 4, in some implementations, the order of the optical devices, such as, the optical amplifier 404 and the optical modulator 406 may be reversed. The light source 402 may be optically coupled to the optical amplifier 404 via the optical waveguide 410A; the optical amplifier 404 may be optically coupled to the optical modulator 406 via the optical waveguide 410B; and the optical modulator 406 may be optically coupled to the photodetector 407 via the optical waveguide 410C. Further, in some examples, the single-channel optical communication system 400 may include the monitoring circuit 408. The monitoring circuit 408 may be as described with respect to monitoring circuit 108.

The light source 402 may be a laser source, such as an internal laser source co-packaged on the substrate or an external laser source coupled to the substrate. The light generated by the light source 402 may be transmitted to the optical amplifier 404 via the optical waveguide 410A. The optical amplifier 404 may amplify the received optical signal. The optical amplifier 404 may be any photonic device such as, but not limited to, a solid-state amplifier, a doped fiber amplifier, a vertical-cavity semiconductor optical amplifier, a tapered amplifier, a Raman amplifier, or an optical parametric amplifier. The optical signal amplified by the optical amplifier 404 may be transmitted to the optical modulator 406 via the optical waveguide 410B. The optical modulator 406 may modulate the received optical signal to transmit useful information over the optical signal. Further, the optical modulator 406 may transmit the modulated signal to the photodetector 407 via the optical waveguide 410C. The photodetector 407 may include one or more photosensitive devices (e.g., photodiodes) that may convert the received optical signal (e.g., the modulated signal) into an electrical signal (e.g., electrical current).

The optical waveguides 410A, 410B, and 410C may include in-situ capacitive structures, for example, the in-situ capacitive structures 412A, 412B, and 412C, respectively. The in-situ capacitive structures 412A, 412B, and 412C may be similar to the in-situ capacitive structure 204 depicted in FIG. 2. The monitoring circuit 408 may be coupled to the in-situ capacitive structures 412A and 412B, at monitoring sites 414A and 414B, respectively. Further, the monitoring circuit 408 may be coupled to the in-situ capacitive structures 412C at the monitoring sites 414C and 414D. In some examples, the monitoring sites 414C and 414D may be spaced apart from each other. In particular, the monitoring sites 414C and 414D may be chosen to be near the ends of the optical waveguides 410C.

The monitoring circuit 408 may apply reference variable voltage signals to the in-situ capacitive structures 412A, 412B, and 412C at the respective monitoring sites 414A-414D to cause the in-situ capacitive structures 412A, 412B, and 412C to generate electrical signals. Further, the monitoring circuit 408 may measure, periodically or when instructed, the electrical signals at the monitoring sites 414A-414D to determine one or more performance parameters, such as, but not limited to, an output optical power of the light source 402, an amplification gain, an insertion loss, a transmission loss, or a link budget. For example, the monitoring circuit 408 may determine the output optical power of the light source 402 based on the electrical signal measured at the monitoring site 414A. Further, the monitoring circuit 408 may determine the amplification gain based on the electrical signals measured at the monitoring sites 414A and 414B. In particular, in one example, the monitoring circuit 408 may divide the electrical signal measured at the monitoring site 414B by the electrical signal measured at the monitoring site 414A. Furthermore, in some examples, the monitoring circuit 408 may determine the insertion loss caused by the optical modulator 406 based on the electrical signals measured at the monitoring sites 414B and 414C. In particular, in one example, the monitoring circuit 408 may divide the electrical signal measured at the monitoring site 414C by the electrical signal measured at the monitoring site 414B to determine the insertion loss.

Moreover, in some examples, the monitoring circuit 408 may determine the transmission loss across the optical waveguide 410C based on the electrical signals measured at the monitoring sites 414C and 414D. In particular, in one example, the monitoring circuit 408 may divide the electrical signal measured at the monitoring site 414D by the electrical signal measured at the monitoring site 414C to determine the transmission loss. Also, in certain examples, the monitoring circuit 408 may determine the link budget based on the electrical signals measured at the monitoring sites 414A and 414D. In particular, in one example, the monitoring circuit 408 may divide the electrical signal measured at the monitoring site 414D by the electrical signal measured at the monitoring site 414A to determine the link budget.

FIG. 5A illustrates an example DWDM transmitter 500A. The DWDM transmitter 500A of FIG. 5A may be an implementation of the optical system 100 of FIG. 1. In the example implementation shown in FIG. 5A, the DWDM transmitter 500A may include a light source 501, a coupling waveguide 502, a plurality of optical modulators 504A, 504B, and 504C (also collectively referred to as optical modulators 504A-504C), and an optical output 508. In some examples, the light source 501 may be coupled to one end of the coupling waveguide 502. The light source 501 may be a light generation device capable of generating light with multiple wavelengths. A non-limiting example of the light source 501 may include a comb laser that can generate multi-wavelength light. The optical modulators 504A-504C may be disposed adjacent to and are evanescently coupled to the coupling waveguide 502. Although the optical modulators 504A-504C are shown as being ring modulators, the use of other types of optical modulators is also envisioned within the purview of the present disclosure. Moreover, in some examples, greater or fewer optical modulators may be used depending on application and/or requirements, without limiting the scope of the present disclosure. Also, the optical modulators 504A-504C are collectively referred to as a bank of optical modulators 504. The optical output 508 may be coupled to another end of the coupling waveguide 502 and is used to couple output light of the DWDM transmitter 500A to an external system, for example, a DWDM receiver (see FIG. 5A). Non-limiting examples of the optical output 508 may include, but are not limited to, a prism coupler, a grating coupler, or an end-fire coupler.

Further, in some examples, one or more of the coupling waveguide 502 or the optical modulators 504A-504C may include in-situ capacitive structures similar, in one or more aspects, to the in-situ capacitive structure 204 depicted in FIG. 2. For example, the coupling waveguide 502 may include an in-situ capacitive structure 510A, and one or more of the optical modulators 504A-504C may also include an in-situ capacitive structure 5106. Further, the reference numerals 512, 514, represent monitoring sites along the in-situ capacitive structure 510A. Similarly, the reference numerals 516, 518, and 520 may represent monitoring sites along the in-situ capacitive structures 5106 of the optical modulators 504A-504C. The monitoring sites 512, 514, 516, 518, and 520 are also collectively referred to as monitoring sites 512-520.

As depicted in FIG. 5A, the DWDM transmitter 500A may also include the monitoring circuit 108A that may be electrically connected to one or more of the monitoring sites 512-520. As previously described, during operation, the monitoring circuit 108A may apply reference variable voltage signal to the in-situ capacitive structures 510A, 510B at one or more of the monitoring sites 512-520. Consequently, electrical signals (e.g., electrical currents) measured at the respective monitoring sites 512-520 may be representative of the light intensities at the respective monitoring sites 512-520. Based on the electrical signals measured at the respective monitoring sites 512-520, the monitoring circuit may determine one or more performance parameters, such as, but not limited to, an output optical power of the light source 501, an insertion loss of the bank of the optical modulators 504, and/or light intensities inside the optical modulators 504A-504C.

The monitoring circuit 108A may determine light intensities inside the optical modulators 504A-504C based on the electrical signals measured at the monitoring sites 514, 516, and 518, respectively. Further, in some examples, the monitoring circuit 108A may determine the output optical power of the light source 501 based on the electrical signal measured at the monitoring site 512. Further, in some examples, the monitoring circuit 108A may determine the insertion loss caused by the bank of the optical modulators 504A-504C based on the electrical signals measured at the monitoring sites 512 and 520. In particular, in one example, the monitoring circuit 108A may divide the electrical signal measured at the monitoring site 500 by the electrical signal measured at the monitoring site 512 to determine the insertion loss.

Referring now to FIG. 5B, a DWDM receiver 500B is presented, in accordance with an example. The DWDM receiver 500B of FIG. 5B may be representative of one example of the optical system 100 of FIG. 1. In the example implementation shown in FIG. 5B, the DWDM receiver 500B may include an optical input 522, a coupling waveguide 524, and a plurality of optical demodulators 526A, 526B, and 526C (also collectively referred to as optical demodulators 526A-526C).

Examples of the optical input 522 may include, but are not limited to, an end-fire coupler, prism coupler, or a grating coupler, which may be coupled to one end of the coupling waveguide 524. In order to receive an optical signal, the optical input 522 may be coupled to the optical output 508 of the DWDM transmitter 500A shown in FIG. 5A, in some examples. The optical demodulators 526A-526C may be disposed adjacent to and evanescently coupled to the coupling waveguide 524. Although the optical demodulators 526A-526C are shown as being ring demodulators, the use of other types of optical demodulators is also envisioned within the purview of the present disclosure. Moreover, in some examples, greater or fewer optical demodulators may be used depending on application and/or requirements, without limiting the scope of the present disclosure. Also, the optical demodulators 526A-526C are collectively referred to as a bank of optical demodulators 526.

Further, in some examples, one or more of the optical input 522, the coupling waveguide 524, and the plurality of optical demodulators 526A-526C may include in-situ capacitive structures that may be similar, in one or more aspects, to the in-situ capacitive structure 204 depicted in FIG. 2. For example, the coupling waveguide 524 may include an in-situ capacitive structure 528A, and one or more of the optical demodulators 526A-526C may also include in-situ capacitive structure 528B. Further, the reference numerals 530, 532, represent monitoring sites along the in-situ capacitive structure 528A. Similarly, the reference numerals 534, 536, and 538 may represent monitoring sites along the in-situ capacitive structures 528B of the optical demodulators 526A-526C. The monitoring sites 530, 532, 534, 536, and 538 are also collectively referred to as monitoring sites 530-538.

Further, the DWDM receiver 500B may also include the monitoring circuit 108B that may be electrically connected to one or more of the monitoring sites 530-538. As previously described, during operation, the monitoring circuit 108B may apply reference variable voltage signal to the in-situ capacitive structures 528A, 528B at one or more of the monitoring sites 530-538. Consequently, electrical signals (e.g., electrical currents) measured at the respective monitoring sites 530-538 may be representative of the light intensities at the respective monitoring sites 530-538. Based on the electrical signals measured at the respective monitoring sites 530-538, the monitoring circuit 108B may determine one or more performance parameters, such as, but not limited to, an insertion loss of the bank of the optical demodulators 526, an incoming optical power, the light intensities inside the optical demodulators 526A-526C. For example, the monitoring circuit 108B may determine light intensities inside the optical demodulators 526A-526C based on the electrical signals measured at the monitoring sites 534, 536, and 538, respectively. Further, in some examples, the monitoring circuit 108B may determine an incoming power at the optical input 522 based on the electrical signal measured at the monitoring site 530. Further, in examples, the monitoring circuit 108B may determine the insertion loss caused by the bank of the optical demodulators 526A-526C based on the electrical signals measured at the monitoring sites 530 and 538. In particular, in one example, the monitoring circuit 108B may divide the electrical signal measured at the monitoring site 538 by the electrical signal measured at the monitoring site 530 to determine the insertion loss caused by the bank of the optical demodulators 526A-526C.

In the example implementations depicted in FIGS. 5A-5B, the DWDM transmitter 500A and the DWDM receiver 500B are shown to have respective separate monitoring circuits 108A and 108B. In some other examples, the DWDM transmitter 500A and the DWDM receiver 500B may share a common monitoring circuit that can perform one or more of the operations performed by the monitoring circuits 108A and 108B.

In certain examples, the monitoring circuits 108A and 108B may be communicatively coupled to each other via wired connections and/or wireless connections (e.g., radio-frequency communication links or optical communication links). The monitoring circuits 108A and 108B may share information of the measurements with each other to determine additional parameters, such as the link loss between the DWDM transmitter 500A and the DWDM receiver 500B. For example, one or both of the monitoring circuits 108A and 108B may determine the link loss based on electrical signals measured at the monitoring sites 514 and 530. In particular, in some examples, one or both of the monitoring circuits 108A and 108B may determine the link loss by dividing the electrical signal measured at the monitoring site 514 by the electrical signal measured at the monitoring site 530.

Further, in some examples, the DWDM transmitter 500A may include a control circuit 540A operatively coupled to the optical modulators 504A-504C, and the DWDM receiver 500B may include a control circuit 540B operatively coupled to the optical demodulators 526A-526C. Further, the control circuits 540A and 540B may be communicatively coupled to the monitoring circuits 108A and 108B, respectively. The control circuits 540A and 540B may be configured to tune operating wavelengths of one or more of the plurality of optical devices (for example, the optical modulators 504A-504C and/or the optical demodulators 526A-526C) based on the measured electrical signals at one or more of the monitoring sites 516, 518, 520, 534, 536, and 538. For example, tuning of the operating wavelengths may include locking (e.g., synchronizing) the resonant wavelengths of the optical demodulators 526A-526C with the respective optical modulators 504A-504C, or vice-versa. In the example implementation of FIGS. 5A-5B, the resonant wavelengths of the optical demodulators 526A, 526B, and 526C may be respectively synchronized with the optical modulators 504A, 504B, and 504C. In some examples, the functionalities of the control circuits 540A and 540B may be integrated in the monitoring circuits 108A and 108B, respectively.

Figure 6:
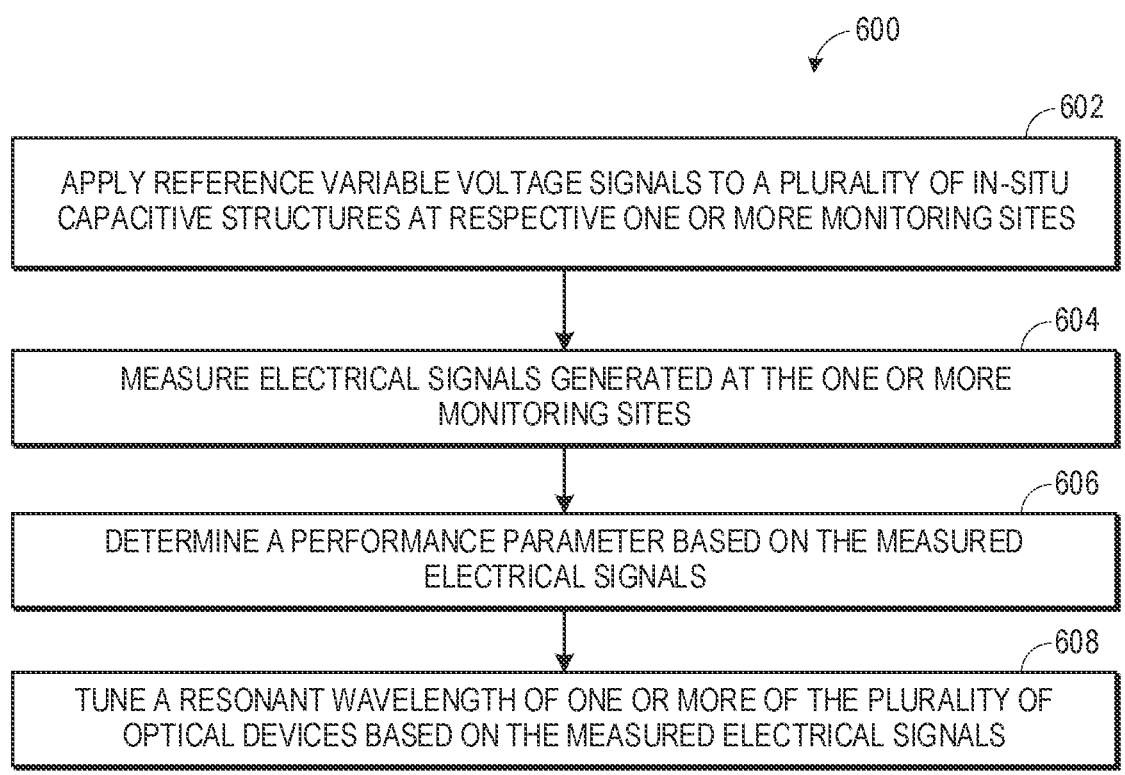
FIG. 6 depicts a flowchart of a method of monitoring an optical system, in accordance with an example.

FIG. 6 illustrates an example method 600 of monitoring an optical system. For illustration purposes, the example method 600 is described in conjunction with FIGS. 5A-5B. It is to be noted that example method 600 may apply to other optical systems as well.

At block 602, a monitoring circuit may apply reference variable voltage signals to a plurality of in-situ capacitive structures at respective one or more monitoring sites. In the example optical system, such as, the DWDM transmitter 500A, the monitoring circuit 108A may apply reference variable voltage signals to a plurality of in-situ capacitive structures 510A, 510B at respective one or more monitoring sites 512-520. Further, at block 604, the monitoring circuit may measure electrical signals generated at one or more monitoring sites. For example, in the DWDM transmitter 500A, the monitoring circuit 108A may measure the electrical currents at one or more of the monitoring sites 512-520. Furthermore, at block 606, the monitoring circuit may determine a performance parameter based on the measured electrical signals. The ongoing example of the DWDM transmitter 500A, determining the performance parameters at block 606, may include determining, by the monitoring circuit 108A, one or more performance parameters such as, but not limited to, the output optical power of the light source 501, the insertion loss of the bank of the optical modulators 504, and/or the light intensities inside the optical modulators 504A-504C based on the electrical signals measured at the monitoring sites 512-520.

Moreover, in certain examples, at block 608, the monitoring circuit may also tune an operating wavelength of one or more of the plurality of optical devices based on the measured electrical signals. In some examples, the monitoring circuit, such as the monitoring circuits 108A, 108B, may tune the operating wavelengths of the optical modulators 504A-504C and/or the optical demodulators 526A-526C) based on the measured electrical signals. For example, tuning of the operating wavelengths may include locking (e.g., synchronized) the resonant wavelengths of the optical demodulators 526A-526C with the respective optical modulators 504A-504C, or vice-versa. In the example, implementation of FIGS. 5A-5B, the resonant wavelengths of the optical demodulators 526A, 526B, and 526C may be respectively synchronized with the optical modulators 504A, 504B, and 504C. In some examples, the operation at block 608 may be performed by the control circuits 540A, 540B.

As will be appreciated, in one or more examples, the monitoring circuit may determine values of one or more parameters such as, but not limited to, the output of a light source, an optical power inside the optical devices, an optical gain, an insertion loss, a link budget, etc., based on the electrical signal received from the respective in-situ capacitive structures. In particular, the in-situ capacitive structures may aid in the detection of light within the respective optical devices without the need of extracting the light out of the optical devices. Further, in some examples, the use of the in-situ capacitive structure may obviate the need for separate photodiodes to monitor the light, resulting in a compact footprint and reduced complexity of the proposed optical system. Moreover, in some examples, by using the in-situ capacitive structures in the optical components and a common monitoring circuit, tasks such as operation monitoring and debugging can be easily performed in the proposed optical system.

The terminology used herein is for the purpose of describing particular examples and is not intended to be limiting. As used herein, the singular forms "a," "an," and "the" are intended to include the plural forms as well, unless the context clearly indicates otherwise. The term "another," as used herein, is defined as at least a second or more. The term "coupled to" as used herein, is defined as connected, whether directly without any intervening elements or indirectly with at least one intervening element, unless indicated otherwise. For example, two elements may be coupled to each other mechanically, electrically, optically, or communicatively linked through a communication channel, pathway, network, or system. Further, the term "and/or" as used herein refers to and encompasses any and all possible combinations of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

While certain implementations have been shown and described above, various changes in form and details may be made. For example, some features and/or functions that have been described in relation to one implementation and/or process may be related to other implementations. In other words, processes, features, components, and/or properties described in relation to one implementation may be useful in other implementations. Furthermore, it should be appreciated that the systems and methods described herein may include various combinations and/or sub-combinations of the components and/or features of the different implementations described. Moreover, method blocks described in various methods may be performed in series, parallel, or a combination thereof. Further, the method blocks may as well be performed in a different order than depicted in flow diagrams.

Further, in the foregoing description, numerous details are set forth to provide an understanding of the subject matter disclosed herein. However, an implementation may be practiced without some or all of these details. Other implementations may include modifications, combinations, and variations from the details discussed above. It is intended that the following claims cover such modifications and variations.

What is claimed is:

1. An optical system, comprising:
   a light-conducting medium;
   a first optical device to transmit an optical signal over the light-conducting medium;
   a second optical device coupled to the light-conducting medium to receive the optical signal transmitted by the first optical device, wherein at least one of the first optical device, the light-conducting medium, and the second optical device comprises a capacitive structure to detect light intensity; and
   a monitoring circuit electrically coupled to the capacitive structure to cause generation of an electrical signal via the capacitive structure indicative of the light intensity detected by the capacitive structure;
   wherein, the capacitive structure comprises:
      a waveguide region comprising a first-type doping and carrying the optical signal, wherein the waveguide region comprises one or more defect sites causing generation of free charge carriers relative to an intensity of the optical signal in the waveguide region resulting in a change in a conductance of the waveguide region;
      a buffer semiconductor region comprising a second-type doping; and
      an insulating layer disposed between the waveguide region and the buffer semiconductor region.

2. The optical system of claim 1, wherein the first optical device comprises one of a light source, an optical amplifier, an optical modulator, an optical splitter, an optical combiner, an optical coupler, an optical filter, an optical resonator, or a photodetector.

3. The optical system of claim 1, wherein the second optical device comprises one of an optical amplifier, an optical modulator, or a photodetector.

4. The optical system of claim 1, wherein the capacitive structure further comprises a first contact region comprising the first-type doping and disposed in contact with the waveguide region.

5. The optical system of claim 4, wherein the capacitive structure further comprises a second contact region comprising the second-type doping and disposed in contact with the buffer semiconductor region.

6. The optical system of claim 5, wherein the monitoring circuit is electrically coupled to the first contact region and the second contact region via respective metal contacts to:
apply a reference variable voltage signal to the first contact region; and
measure an electrical current flowing through the second contact region.

7. An optical system, comprising:
an optical modulator;
a coupling waveguide disposed adjacent to the optical modulator and comprising a first capacitive structure formed along at least a portion of the coupling waveguide to detect light intensity inside the coupling waveguide; and
a monitoring circuit electrically connected to the first capacitive structure at a first monitoring site and at a second monitoring site to cause generation of a first electrical signal and a second electrical signal via the first capacitive structure indicative of the light intensities at the first monitoring site and the second monitoring site, respectively, wherein the optical modulator is optically coupled to the coupling waveguide between the first monitoring site and the second monitoring site and the monitoring circuit determines an insertion loss of the optical modulator based on the first electrical signal and the second electrical signal.

8. The optical system of claim 7, wherein the optical modulator comprises a second capacitive structure to detect light intensity inside the optical modulator.

9. The optical system of claim 7, further comprising one or more additional optical modulators optically coupled to the coupling waveguide between the first monitoring site and the second monitoring site forming a bank of optical modulators comprising the optical modulator and the one or more additional optical modulators.

10. The optical system of claim 9, wherein the monitoring circuit determines an insertion loss of the bank of optical modulators based on the first electrical signal and the second electrical signal.

11. The optical system of claim 9, wherein the first capacitive structure comprises a waveguide region comprising a first-type doping and carrying an optical signal, wherein the waveguide region comprises one or more defect sites causing generation of free charge carriers relative to an intensity of the optical signal in the waveguide region resulting in a change in a conductance of the waveguide region.

12. The optical system of claim 11, wherein the first capacitive structure further comprises a buffer semiconductor region comprising a second-type doping.

13. The optical system of claim 12, wherein the first capacitive structure further comprises an insulating layer disposed between the waveguide region and the buffer semiconductor region.

14. The optical system of claim 12, wherein the first capacitive structure further comprises:
a first contact region comprising the first-type doping and disposed in contact with the waveguide region; and
a second contact region comprising the second-type doping and disposed in contact with the buffer semiconductor region.

15. The optical system of claim 14, wherein the monitoring circuit is electrically coupled to the first contact region and the second contact region via respective metal contacts to:
apply a reference variable voltage signal to the first contact region; and
measure an electrical current flowing through the second contact region.

16. A method, comprising:
applying, by a monitoring circuit, reference variable voltage signals to a monitoring site of a first capacitive structure and a monitoring site of a second capacitive structure, wherein the first capacitive structure is formed in a coupling waveguide and the second capacitive structure is formed in an optical device optically coupled to the coupling waveguide;
measuring, by the monitoring circuit, electrical signals generated at the monitoring site of the first capacitive structure and the monitoring site of the second capacitive structure; and
determining, by the monitoring circuit, at least one of an amplification gain and an insertion loss caused by the optical device based on the measured electrical signals.

17. The method of claim 16, further comprising tuning an operating wavelength of the optical device based on the measured electrical signals.

* * * * *